United States Patent [19]

Ramey et al.

[11] Patent Number: 5,505,628
[45] Date of Patent: Apr. 9, 1996

[54] MEMORY CARD FRAME AND COVER KIT

[75] Inventors: Samuel C. Ramey, Pasadena, Calif.; John Oldendorf, Prospect Heights; James F. McQuillen, Glen Ellyn, both of Ill.

[73] Assignee: Methode Electronics, Inc., Chicago, Ill.

[21] Appl. No.: 183,665

[22] Filed: Jan. 21, 1994

Related U.S. Application Data

[63] Continuation-in-part of Ser. No. 73,163, Jun. 7, 1993.

[51] Int. Cl.⁶ .................................................. H01R 9/09
[52] U.S. Cl. ........................................... 439/76.1; 439/59
[58] Field of Search ........................... 439/76, 78, 79, 439/73, 59, 62, 64, 142, 188, 352, 65; 361/737; 235/492

[56] References Cited

U.S. PATENT DOCUMENTS

| | | | |
|---|---|---|---|
| 5,053,613 | 10/1991 | Onoda | 361/737 X |
| 5,196,994 | 3/1993 | Tanuma et al. | 439/65 X |
| 5,207,586 | 5/1993 | MacGregor et al. | 439/76 |
| 5,278,445 | 1/1994 | Nemura et al. | 235/492 X |

*Primary Examiner*—David L. Pirlot
*Attorney, Agent, or Firm*—David L. Newman

[57] ABSTRACT

A memory card comprises a metallic top cover, metallic bottom cover and frame housing a PC board and electrical connector. The top and bottom covers are joined by mechanical attachment to the frame and are grounded together by electro-mechanical connection and provide for grounding between the PC board and the covers. Mechanical latching mechanism provides for easy assembly of frame and covers by all vertical assembly. Integral spring tabs provide grounding of PC board and provide frictional pressure against PC board to provide stability of assembly.

6 Claims, 8 Drawing Sheets

MEMORY CARD FRAME AND COVER KIT

This application is a continuation-in-part of U.S. Ser. No. 07/073,163, filed on Jun. 7, 1993.

BACKGROUND OF THE INVENTION

This invention pertains to integrated circuit memory cards and in particular, a memory card having an improved frame and cover.

IC cards and mating sockets of free insertion and withdrawal capability having the capabilities to store large amounts of information and enact logical and calculating functions and have been developed to comprise thin, card-like plastic and metallic outer package which house a frame and a semiconductor/integrated circuit device and an electrical connector for electrically connecting the semiconductor device to external equipment. Such devices will be referred to hereinafter as memory cards. The memory cards have found widespread use as storage devices for data and programs for video games and microcomputers. A conventional memory card has a plastic and metallic outer package consisting of an upper section and a lower section and a frame. The two sections package, surround and protect integrated circuit devices on a printed circuit (PC) board.

It has been known in the art to secure the two sections to one another by applying a viscous bonding agent to the connecting surfaces and pressing the surfaces of one package section against the connecting surface of the other package section. Connecting the top and bottom sections using adhesives is time consuming and can become problematic when the adhesive leaks or runs onto the PC board. It is important in these memory cards to provide a grounding means. Such grounding has been achieved by bonding tabs between the frame and the PC board. Such grounding is very expensive due to the assembly required in order to solder the PC board during manufacturing.

SUMMARY OF THE INVENTION

A principal object of the present invention to provide a frame and covers which may be assembled without the use of bonding or adhesives.

It is another object of the present invention to provide a frame and covers which may be vertically assembled.

It is a further object of the present invention to provide a frame and covers having a built-in grounding clip so that no extra assembly is required.

It is another object of this invention to provide a memory card frame and cover which would eliminate possible compatibility problems.

In order to solve the above problems, this invention provides a memory card housing for housing a semi-conductor device comprising a frame having supports for holding a printed circuit board, a top metallic cover having a means for mechanically securing the top cover to the frame and a bottom metallic cover having a means for mechanically securing the bottom cover to the frame. The top and bottom metallic covers are 0.008 inch thick, quarter hard stainless steel. The top or bottom cover include a vertical tab at a first end of the cover. A first end of the frame includes a port for receiving a modular header. The first end is integrally molded with the frame. The modular header includes a connector for an external apparatus. The top cover includes a foot integral with the top cover protruding perpendicular to the cover having a means for latching to the frame.

The bottom cover includes a foot integral with the bottom cover and perpendicular to the cover having a means for latching with the frame. The frame includes only four sides and no intermediate support members. A second end of the frame includes an integrally molded header. The header includes a 68 position connector having contacts on 0.05 inch centers.

These and other features of the invention are set forth below in the following detailed description of the presently preferred embodiments.

DETAILED DESCRIPTION OF THE PRESENTLY PREFERRED EMBODIMENTS

The present invention relates to an improved memory card frame and covers. The frame and covers are better understood by reference to FIGS. 1–17 which show various aspects of preferred memory card assemblies.

Figure 1:
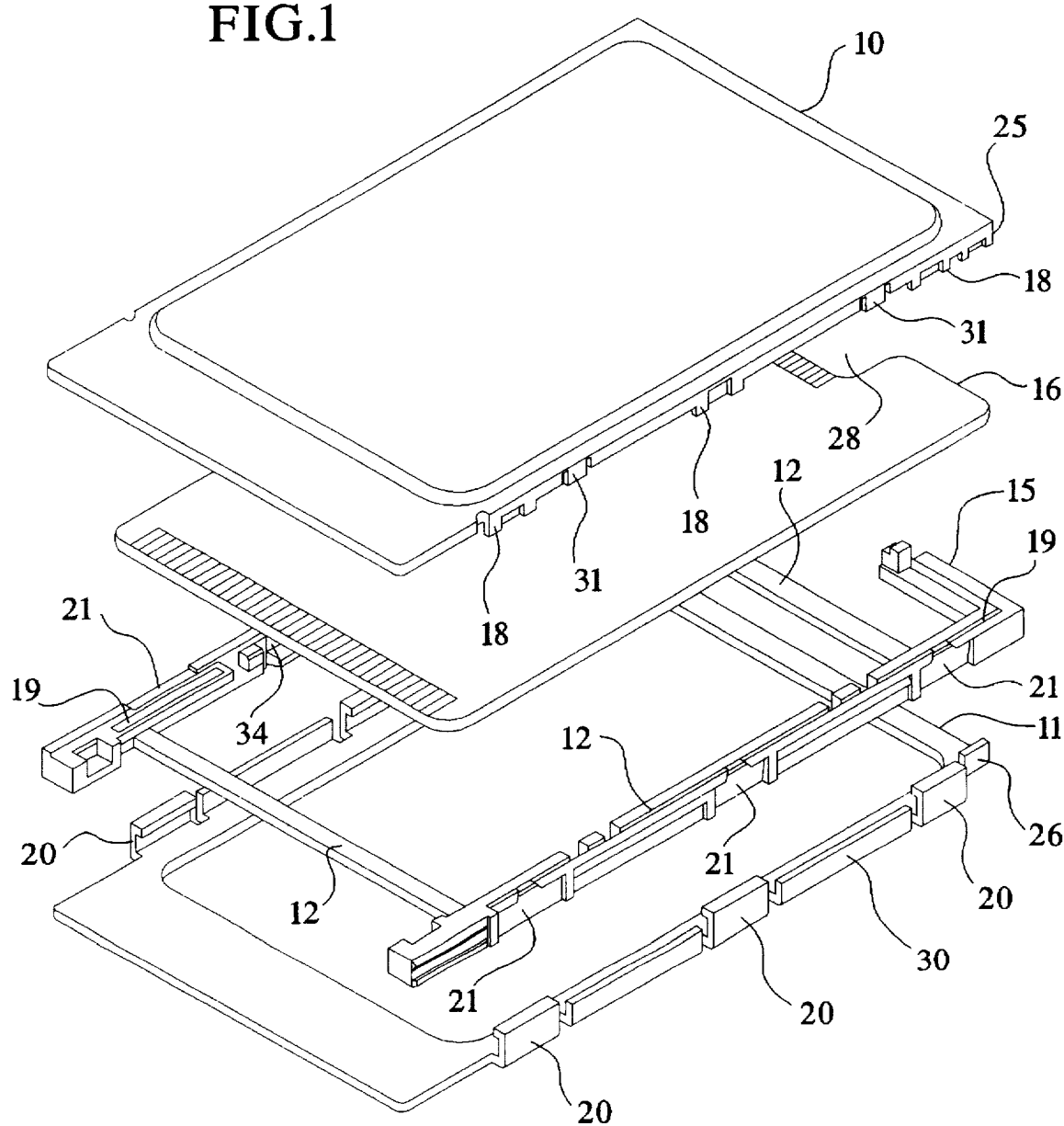
FIG. 1 is a perspective view of an exploded memory card assembly of this invention.

Turning to FIG. 1, top cover 10 and bottom cover 11 are assembled together on frame 15 which holds printed circuit board 16 on supports 12. The covers 10, 11 in a preferred embodiment are constructed of any metallic material such as stainless steel and are drawn in order to provide rigidity and strength in the construction of the covers. In the preferred embodiment, the covers 10, 11 are stepped having a protruding center region which provides further rigidity of the covers. The frame 15 in a preferred embodiment is constructed of any plastic material such as polycarbonate or any thermal plastic. The top cover 10 is secured to the frame 15 by snap tabs 18 which are inserted into snap grooves 19. The snap tabs 18 are located on each side of the top cover 10 and in the preferred embodiment there are three snap tabs 18 on each side of each top cover 10. The snap grooves 19 are correspondingly located to the snap tabs 18 and are likewise locate on both sides of the frame 15 having in the preferred embodiment three snap grooves on each side of the frame 15, providing a total of six (6) snap tabs 18 and corresponding snap grooves 19.

The bottom cover 11 is attached to the frame 15 via latch tabs 20 which latch over the latch surfaces 21 of the frame 15. The latch surfaces 21 are angled inward from the top to the bottom of the frame 15 (see FIG. 5) so that latch tabs 20 easily slide up from the narrow bottom to the top of the latch surface 21 and latches over the top of frame 15. Such mechanical locking pairs of snap tabs 18 with snap grooves 19 and latch tabs 20 with latch surfaces 21 are oriented directly across from each other to provide vertical assembly to avoid twisting or bending of the covers and frame during assembly which may cause breakage or stretching. In a preferred embodiment, the frame and cover assembly includes six (6) points around the perimeter at which locking occurs to provide a total of twelve (12) locking points from top and bottom to provide a secure and stable assembly. The locking points are across from each other on opposite sides of the memory card so that assembly may be accomplished by vertical pressure applied at one end of the memory card followed by vertical pressure applied at the other end of the memory card. Such assembly does not require any twisting or bending of the frame and covers which might occur if the locking points were at opposite corners.

Spring tabs 31 extend perpendicularly from top cover 10 and then bend at approximately a right angle (out of view) inwardly. Spring tabs both hold the PC board 16 and provide grounding between the top cover 10 and the PC board 16 by making contact with a grounding surface of the PC board 16. The spring tabs 31 in the preferred embodiment are located at four (4) locations on the top cover 10 for maximum grounding and securement of the PC board 16. The spring tabs 31 are located in the preferred embodiment only on the top cover 10 to provide stability in holding the PC board 16. Top finger 25 comes into abutting and electrical contact with bottom finger 26 when the covers 10, 11 are assembled onto frame 15. The PC board 16 has an I/O cut-out 28. The ends of the frame 15 are modular in the mold for interchangeability, allowing for the use of multiple I/O connectors. As well, although an I/O connector is optional and the memory card may be constructed without an I/O connector, the I/O connector of an alternative embodiment may also be molded directly as an integral part of the frame 15.

Figure 2:
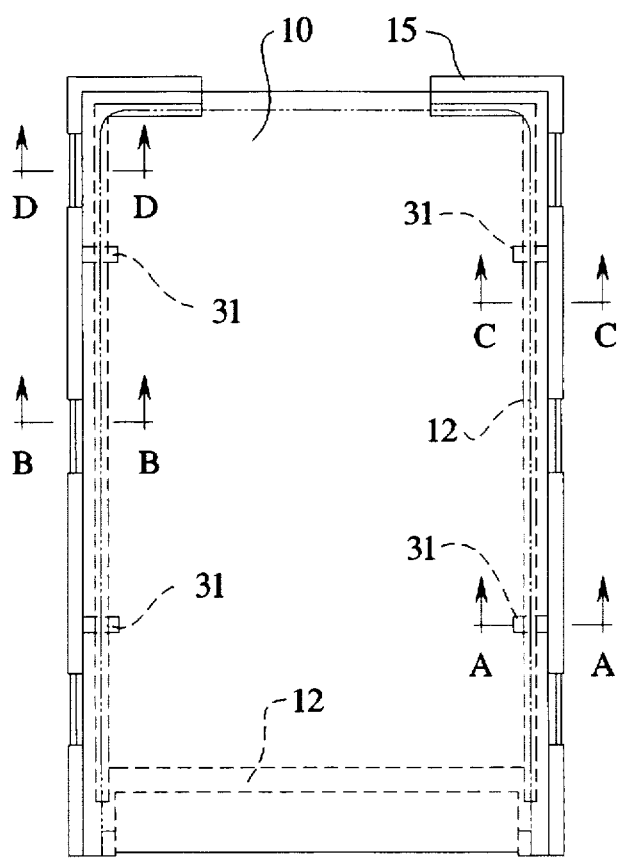
FIG. 2 is a top view of a memory card frame of this invention.

Turning to FIG. 2, the frame 15 has the top cover 10 and bottom cover (not shown) assembled thereon. Cross sections AA and CC are taken along the right side of the frame and cover assembly and cross sections BB and DD are taken along the left side of the frame and cover assembly. Spring tabs 31 extend inwardly from top cover 10 and in the preferred embodiment of this invention are located two on each side of the frame and cover assembly. Supports 12 provide a ledge area around frame 15 to support the PC board 16 when inserted onto the frame 15.

Figure 3:
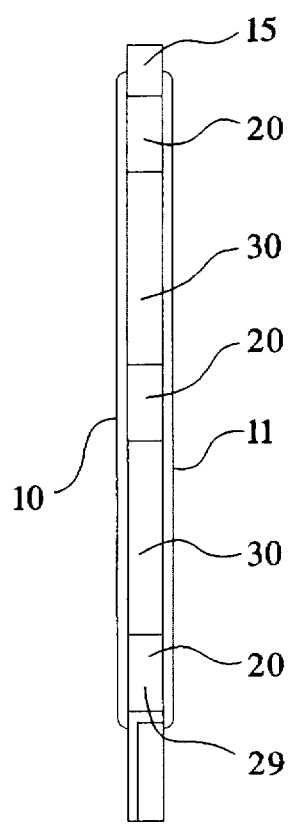
FIG. 3 is a side view of an assembled cover and frame of this invention.

Turning to FIG. 3, the frame 15 is shown having the top cover 10 and bottom cover 11 attached thereto. The assembly of the frame and covers provides sides 29 being completely shrouded in metal for easy grounding at a variety of locations along the frame and cover assembly and eliminates possible grounding incompatibilities. The side 29 is completely shrouded by metallic latch tabs 20 extending from the bottom cover 11 and metallic side portions 30, also extend from the bottom cover 11.

Figure 4:
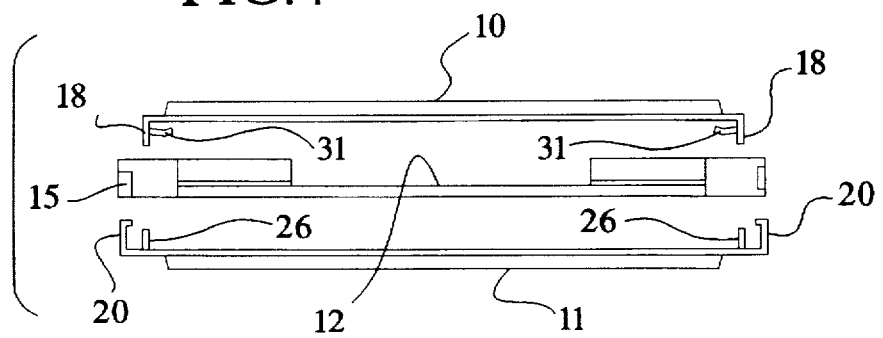
FIG. 4 is an end view of an exploded frame and cover assembly of this invention.

Turning to FIG. 4, top cover 10 is shown having snap tabs 18 which are inserted into frame 15. Frame 15 holds a PC board on supports 12. Spring tabs 31 extend from snap tabs 18 and mechanically hold the PC board to provide a stable nonmoving PC board and act as grounding clips. Bottom cover 11 has latch tabs 20 and bottom fingers 26 which provide electrical contact with the top cover 10.

Figure 5:
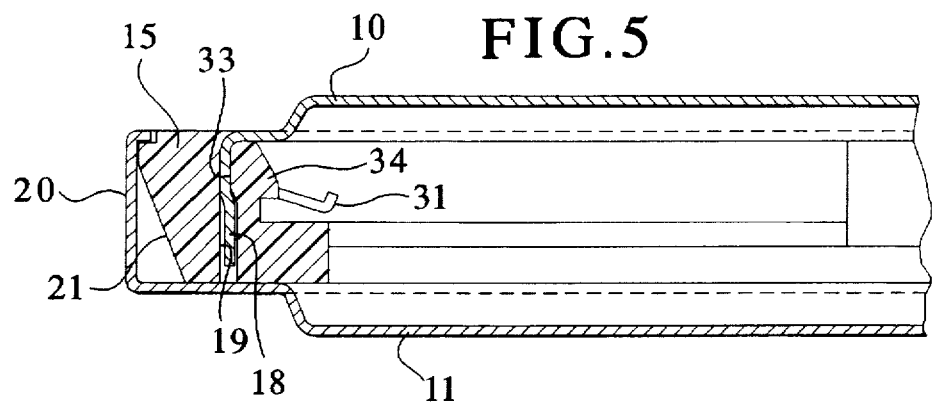
FIG. 5 is an enlarged transverse cross-sectional view of FIG. 2 of this invention taken at Section BB.

Turning to FIG. 5, an enlarged transverse cross-sectional view taken at Section BB of FIG. 2 is shown having top cover 10 inserted onto frame 15. The stepped portion of the protruding center region of top and bottom covers 10, 11 is shown. Snap tab 18 is inserted into snap groove 19 of frame 15. The snap tab 18 engages lip 33 of frame 15 to provide snapping engagement of the top cover 10 within the frame 15. Spring tab 31 protrudes from the frame 15 to hold a printed circuit board thereunder, providing stability and reduce vibration of PC board 16. The spring tab 31 also provides grounding of a PC board to the covers by spring tab 31 making electrical contact to a grounding surface of PC board 16. A printed circuit board may be held in place by rib 34 which is integrally connected to frame 15 to hold a printed circuit board 16 thereunder. PC board 16 is centered over frame 15 and vertically pushed past rib 34, forcing the rib 34 outward. Once the PC board 16 is pushed completely past the front surface of rib 34, the rib 34 snaps forward locking the PC board 16 thereunder. In the preferred embodiment, the frame 15 includes four (4) such ribs 34 located near the corners of the frame 15 for maximum stability of the PC board 16 within the assembled memory card. Bottom cover 11 is securely attached to the frame 15 by latch tabs 20 which latch over latch surfaces 21. In the preferred embodiment, latch surfaces 21 are angled so that latch tabs 20 easily slide over narrow portion at the bottom of the frame 15 and easily slide upward and outward, while the latch surface 21 broadens, until latch tab 20 latches over the frame 15 to secure bottom cover 11 in place on the frame 15.

Figure 6:
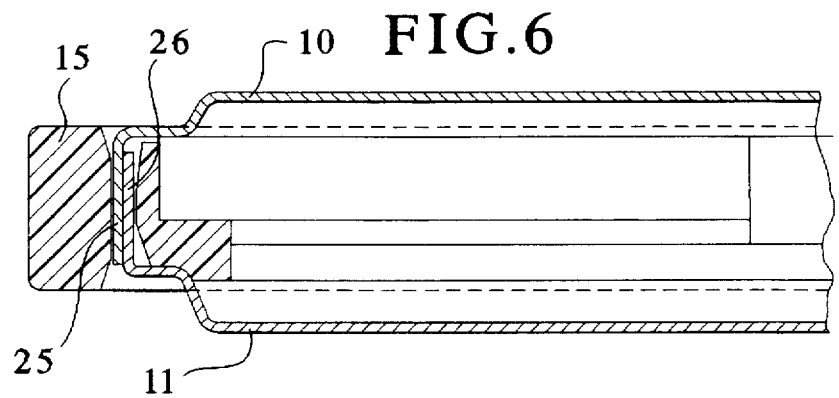
FIG. 6 is an enlarged transverse cross-sectional view of FIG. 2 of this invention taken at Section DD.

Turning to FIG. 6, an enlarged transverse cross-sectional view of FIG. 2 taken at Section DD is shown. The top cover 10 is shown having top finger 25 inserted downward into frame 15. The bottom cover 11 has bottom finger 26 inserted into frame 15 and making electro-mechanical contact between the top finger 25 of top cover 10 and bottom cover 11. The covers by making electro-mechanical contact inside the frame 15, grounds the top and bottom covers 10, 11 together, allowing for grounding anywhere on the covers with the PC board.

Figure 7:
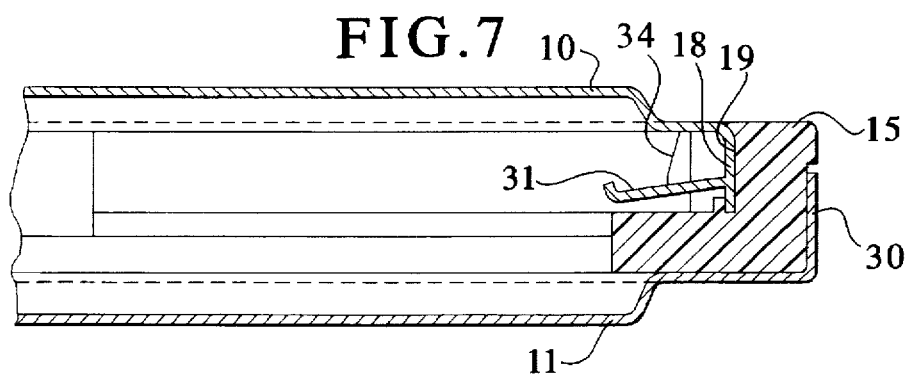
FIG. 7 is an enlarged transverse cross-sectional view of FIG. 2 of this invention taken at Section AA; and, FIG. 8 is an enlarged transverse cross-sectional view of FIG. 2 of this invention taken at Section CC.

Turning to FIG. 7, top cover 10 is shown having snap tab 18 projecting into snap groove 19 in frame 15. Spring tab 31 projects from snap tab 18 and provides grounding and mechanical stability by pressing down on the top of a PC board upon placement of the top cover 10 within the frame 15. Bottom cover 11 is shown having side portion 30 covering the side of frame 15.

Figure 8:
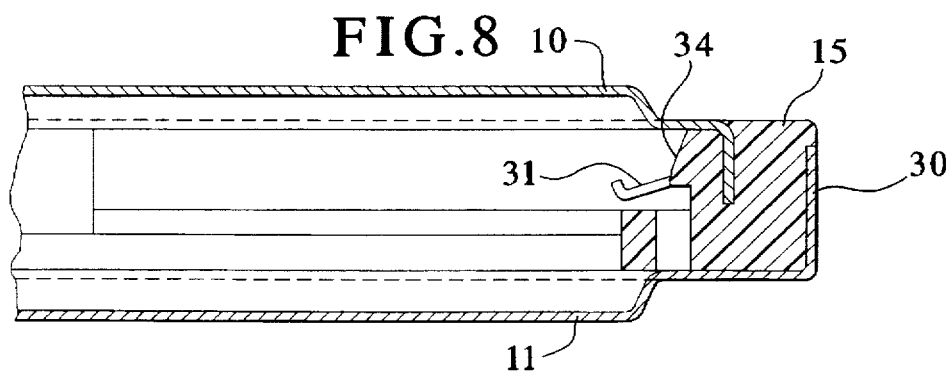

Turning to FIG. 8, top cover 10 is secured to frame 15. Spring tab 31 projects from top cover 10. Bottom cover 11 has side portion 30 to cover the side of frame 15. Rib 34 integral to frame 15 snaps down on a PC board to provide stability within the cover frame assembly.

Figure 9:
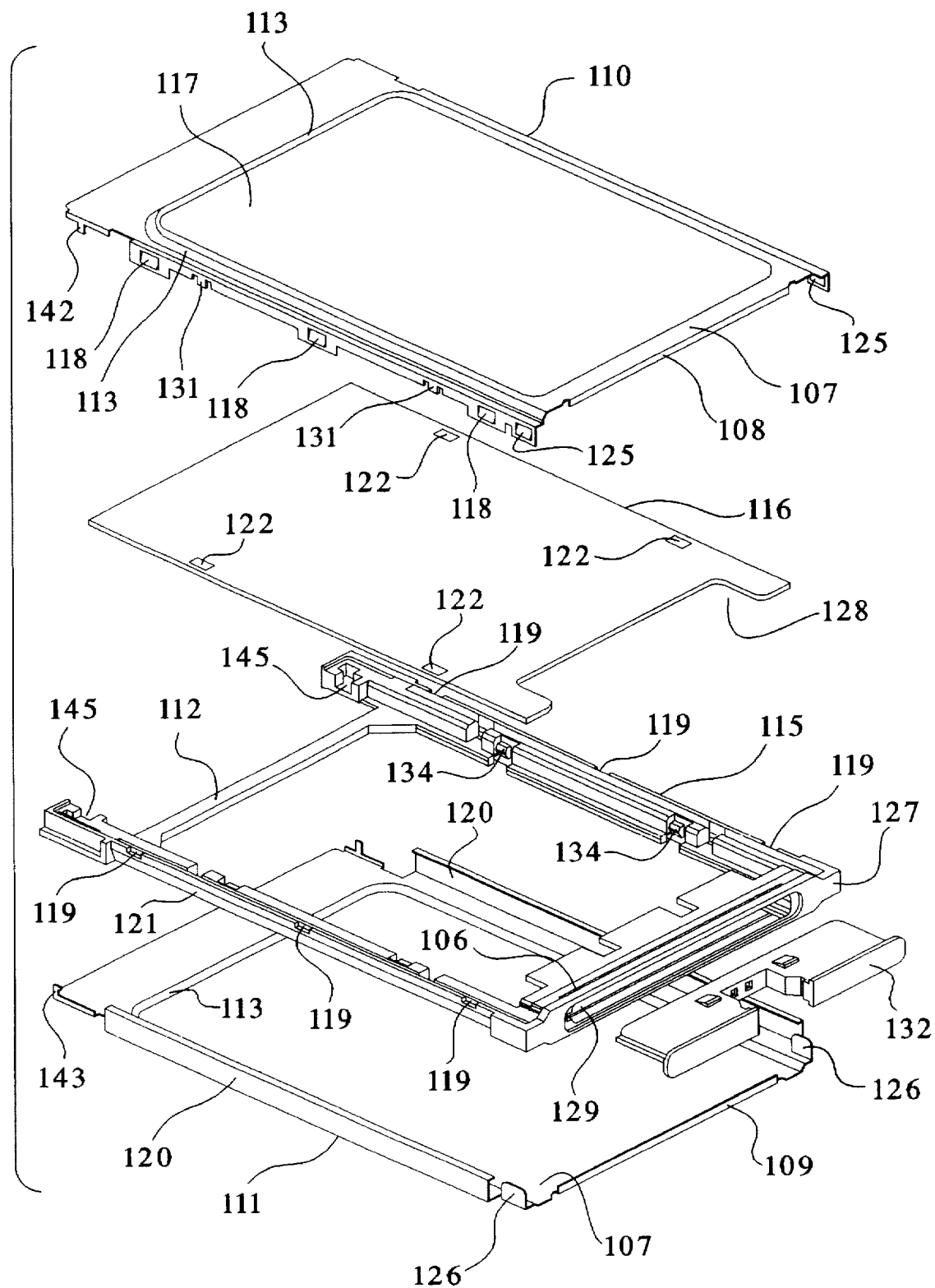
FIG. 9 is a perspective view of an exploded memory card assembly.

Turning to FIG. 9, a further embodiment of the present invention is shown having a top cover 110 and bottom cover 111 assembled together on frame 115 which holds printed circuit board 116 on supports 112. The covers 110, 111 in a preferred embodiment are constructed of any metallic material such as stainless steel and are drawn in order to provide rigidity and strength in the construction of the covers stainless steel. In the preferred embodiment, the covers 110, 111 use 0.008 inch thick 304, ¼ hard stainless steel to provide for rigidity of the covers 110, 111. ¼ hard stainless steel has limited elongation properties; approximately 10% compared to 40% elongation for annealed metals. ¼ hard stainless steel also provides spring-back effect of spring tabs 131 to ensure that the metal springs back to touch with grounding surface 122. Also, ¼ hard stainless steel used for snap tabs 118 provides a spring-back effect so that the snap tabs 118 lock with snap grooves 119. The 0.008 inch thickness of the metallic covers 110, 111 allows for the manufacture of the stepped portion 113 of covers 110, 111 without cracking. The use of the ¼ hard stainless steel also limits the denting of the covers 110,111. Vertical tab 108 of cover 110 and vertical tab 109 of cover 111 provides stability and reduces "oil canning" or twisting of the metal. Further, the covers 110,111 are stepped 113 having a protruding center region 117 which provides further rigidity of the covers 110,111.

The frame 115 in a preferred embodiment is constructed of any plastic material such as polycarbonate or any thermal plastic. The top cover 110 is secured to the frame 115 by snap tabs 118 which are inserted into snap grooves 119. The snap tabs 118 are located on each side of the top cover 110 and in the preferred embodiment there are snap tabs 118 on each side of each top cover 110. The snap grooves 119 are correspondingly located to the snap tabs 118 and are likewise located on both sides of the frame 115 having in the preferred embodiment three snap grooves 119 on each side of the frame 115, providing a total of six (6) snap tabs 118 and corresponding snap grooves 119.

The bottom cover 111 is attached to the frame 115 via a latch tabs 120 which latches over the latch surfaces 121 of the frame 115. The bottom cover 111 has a latch tab 120 which runs along the length of each side of the bottom cover 111. The latch surfaces 121 are angled inward from the top to the bottom of the frame 115 (see FIG. 14) so that latch tabs 120 easily slide up from the narrow bottom to the top of the latch surface 121 and latches over the top of frame 115.

Such mechanical locking pairs of snap tabs 118 with snap grooves 119 are oriented directly across from each other to provide vertical assembly to avoid twisting or bending of the covers and frame during assembly which may cause breakage or stretching. In the embodiment shown in FIG. 9, the frame and cover assembly includes eight (8) points around the perimeter at which locking of the top cover 110 occurs to provide a secure and stable assembly. The locking points are across from each other on opposite sides of the memory card so that assembly may be accomplished by vertical pressure applied at a first end 127 of the memory card followed by vertical pressure applied at a second end 112 of the memory card. Such assembly does not require any twisting or bending of the frame and covers which might occur if the locking points were at opposite corners. A vertical tab 108,109 protrudes perpendicular to the covers 110,111 at the first end 107. The vertical tab 108, 109 is inserted into vertical tab grooves 106 on both sides of frame 115. The vertical tab 108,109 provides for enhanced flatness of the covers 110,111 and relieves stress applied to covers 110,111.

Spring tabs 131 extend perpendicularly from top cover 110 and then bend at approximately a right angle (out of view) inwardly. Spring tabs 131 both hold the PC board 116 and provide grounding between the top cover 110 and the PC board 116 by making contact with a grounding surface 122 of the PC board 116. The spring tabs 131 in the preferred embodiment are located at up to four (4) locations on the top cover 110 for maximum grounding and securement of the PC board 116. The spring tabs 131 are located in the preferred embodiment only on the top cover 110 to provide stability in holding the PC board 116. Top finger 125 comes into abutting and electrical contact with bottom finger 126 when the covers 110, 111 are assembled onto frame 115. The PC board 116 has an I/O cut-out 128. The first end 127 of the frame 115 includes a port 129 for insertion of a modular header 132, allowing for the use of multiple I/O connectors. The frame 115 including an integral first end 127 and a second end 112 provides for a frame which is sufficiently rigid so that no other support members are required. This design allows for more space for the printed circuit board and devices and circuits thereon. As well, although an I/O header is optional, the memory card may be constructed without an I/O header.

Rib 134 protrudes from side of frame 115 to hold the printed circuit board 116 thereunder. The frame has the ribs 134 integrally molded. The frame also includes foothold wells 145 for receiving top foot 142 and bottom foot 143 which are integrally stamped with top cover 110 and bottom cover 111, respectively.

Figure 10:
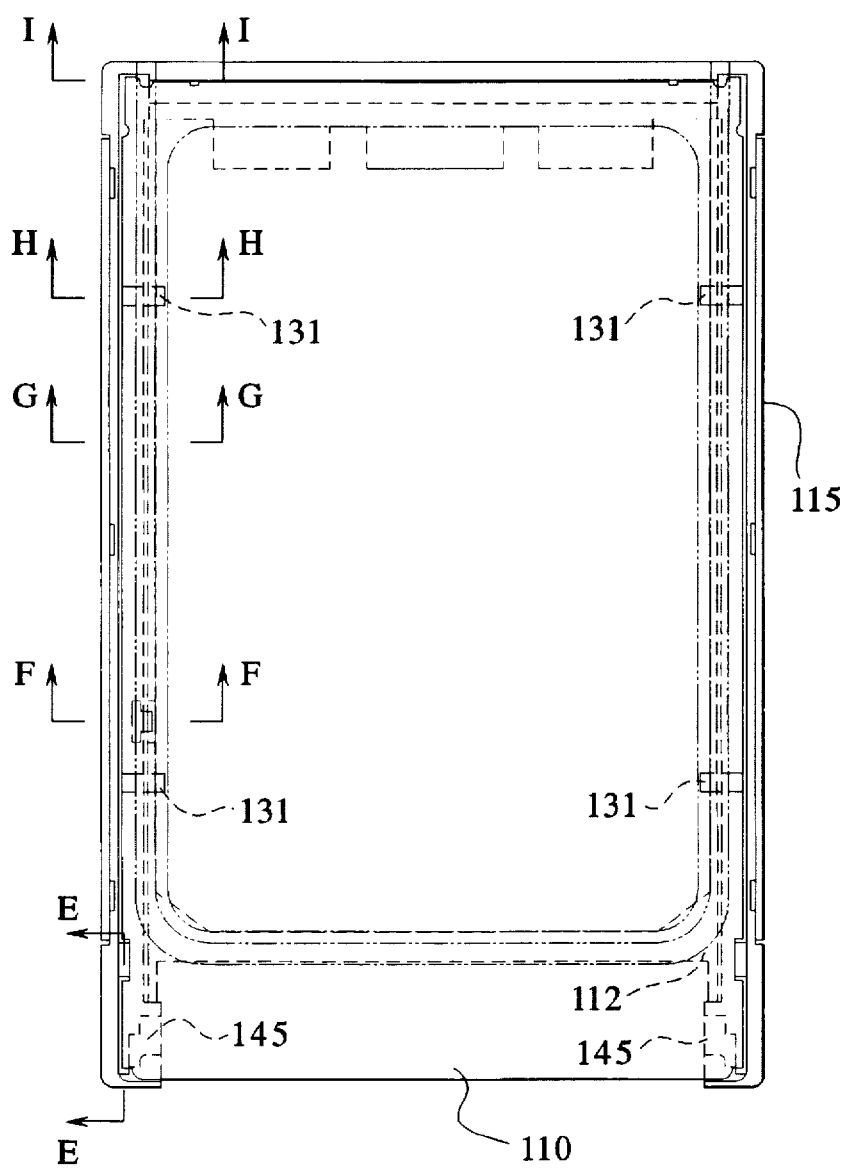
FIG. 10 is a top view of a memory card frame.

Turning to FIG. 10, the frame 115 has the top cover 110 and bottom cover (not shown) assembled thereon. Cross sections EE, FF, GG, HH, II are taken along the left side of the frame and cover assembly. Spring tabs 131 extend inwardly from top cover 110 and in the preferred embodiment of this invention are located two on each side of the frame and cover assembly. Supports 112 provide a ledge area around frame 115 to support the PC board 116 when inserted onto the frame 115. Foothold wells 145 are shown for receiving top foot 142 and bottom foot 145 of the covers.

Figure 11:
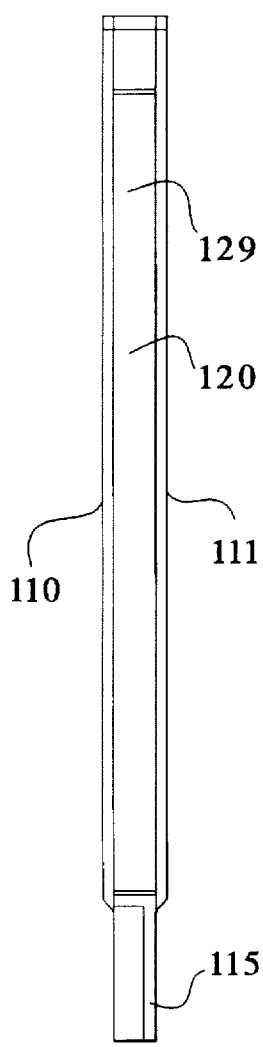
FIG. 11 is a side view of an assembled cover and frame.

Turning to FIG. 11, the frame 115 is shown having the top cover 110 and bottom cover 111 attached thereto. The assembly of the frame and covers provides sides 129 being shrouded in metal for easy grounding at a variety of locations along the frame and cover assembly and eliminates possible grounding incompatibilities. The side 129 is shrouded by metallic latch tabs 120 extending from the bottom cover 111.

Figure 17:
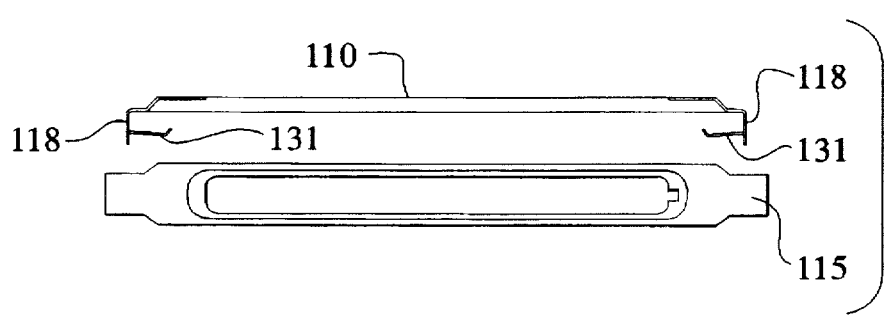
FIG. 17 is an end view of an exploded frame and cover assembly.

Turning to FIG. 17, top cover 110 is shown having snap tabs 118 which are inserted into frame 115. Spring tabs 131 extend from snap tabs 118 and mechanically hold the PC board to provide a stable nonmoving PC board and act as grounding clips.

Figure 13:
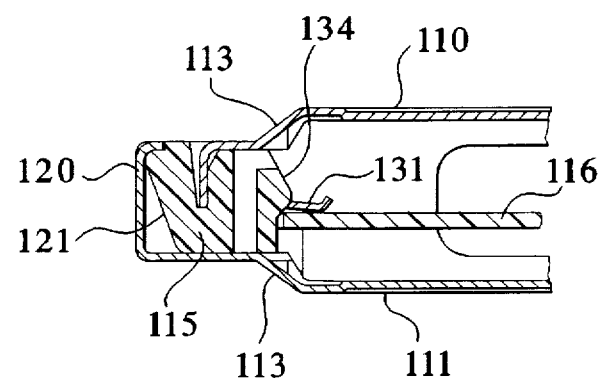
FIG. 13 is an enlarged transverse cross-sectional view of FIG. 10 of this invention taken at Section FF.

Turning to FIG. 13, an enlarged transverse cross-sectional view taken at Section FF of FIG. 10 is shown having top cover 110 inserted onto frame 115. The stepped portion 113 of the protruding center region 117 of top and bottom covers 110, 111 is shown. Snap tab 118 is inserted into snap groove 119 of frame 115. Spring tab 131 protrudes from the frame 115 to hold a printed circuit board 116 thereunder, providing stability and to reduce vibration of PC board 116. The spring tab 131 also provides grounding of a PC board to the covers by spring tab 131 making electrical contact to a grounding surface 122 of PC board 116. A printed circuit board may be held in place by rib 134 which is integrally connected to frame 115 to hold a printed circuit board 116 thereunder. PC board 116 is centered over frame 115 and vertically pushed past rib 134, forcing the rib 134 outward. Once the PC board 116 is pushed completely past the front surface of rib 134, the rib 134 snaps forward locking the PC board 116 thereunder. In the preferred embodiment, the frame 115 includes four (4) such ribs 134 located near the corners of the frame 115 for maximum stability of the PC board 116 within the assembled memory card. Bottom cover 111 is securely attached to the frame 115 by latch tabs 120 which latch over latch surfaces 121. In the preferred embodiment, latch surfaces 121 are angled so that latch tabs 120 easily slide over narrow portion at the bottom of the frame 115 and easily slide upward and outward, while the latch surface 121 broadens, until latch tab 120 latches over the frame 115 to secure bottom cover 111 in place on the frame 115.

Figure 16:
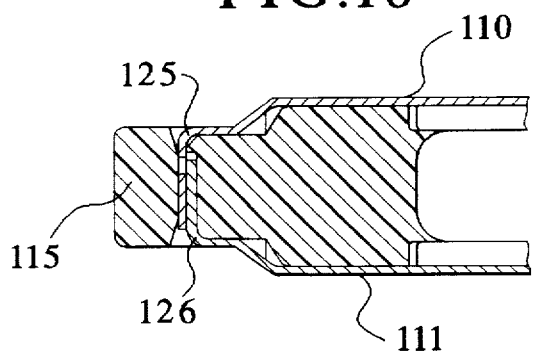
FIG. 16 is an enlarged transverse cross-sectional view of FIG. 10 taken at Section II.

Turning to FIG. 16, an enlarged transverse cross-sectional view of FIG. 10 taken at Section II is shown. The top cover 110 is shown having top finger 125 inserted downward into frame 115. The bottom cover 111 has bottom finger 126 inserted into frame 115 and making electro-mechanical contact between the top finger 125 of top cover 110 and bottom cover 111. The covers by making electro-mechanical contact inside the frame 15, grounds the top and bottom covers 110, 111 together, allowing for grounding anywhere on the covers with the PC board.

Figure 15:
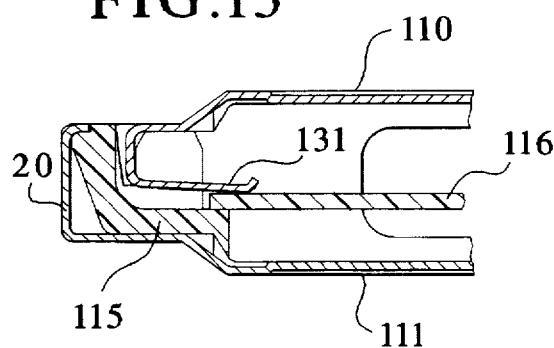
FIG. 15 is an enlarged transverse cross-sectional view of FIG. 10 taken at Section HH.

Turning to FIG. 15, spring tab 131 projects from top cover 110 and provides grounding and mechanical stability by pressing down on the top of a PC board 116 upon placement of the top cover 110 within the frame 115. Bottom cover 111 is shown having side portion 120 covering the side of frame 115.

Figure 14:
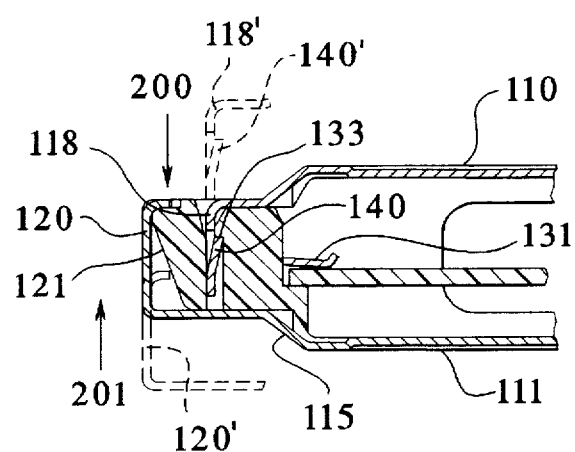
FIG. 14 is an enlarged transverse cross-sectional view of FIG. 10 taken at Section GG.

Turning to FIG. 14, top cover 110 is secured to frame 115. A phantom of snap tab 118' is shown being inserted into frame 115 in direction of arrow 200. As snap tab 118' is pushed into snap groove 119 detente 140' is compressed against the body of the snap tab 118'. Upon full insertion and fully mated position of snap tab 118' within snap groove 119 of frame 115, the detente 140 of snap tab 118' snaps into a seated position under lip 133 holding the top cover 110 firmly to frame 115. A phantom of latch tab 120' is shown being latched to frame 115 in direction of arrow 201. As latch tab 120' slides along latch surface 121 of frame 115 the latch tab 120' bends outwardly. Upon attaining a fully mated position of bottom cover 111 to frame 115 the latch tab 120' snaps back against frame 115 and securely holds bottom cover 111 onto frame 115. Spring tab 131 projects from top cover 110.

Figure 12:
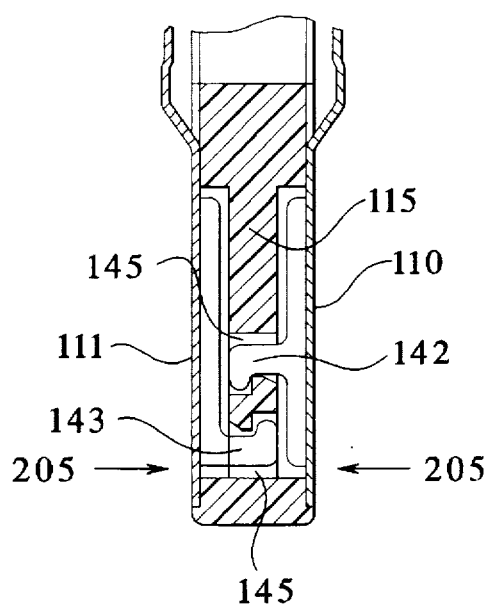
FIG. 12 is an enlarged transverse cross-sectional view of FIG. 10 taken at Section EE.

Turning to FIG. 12, a longitudinal cross-section of frame 115 is taken at Section EE of FIG. 10. This view shows an additional means of securing the covers 110,111 to frame 115. Top foot 142 is shown projecting away from and perpendicular to top cover 110. The top foot 142 is integral to the top cover 110. The top foot 142 is inserted into foothold well 145 and is secured therein. Bottom foot 143 of bottom cover 111 is also secured within foothold well 145. Top cover 110 and bottom cover 111 are pushed in direction of arrows 205 to snap bottom foot 143 and top foot 142 within foothold well 145 of frame 115.

Figure 18:
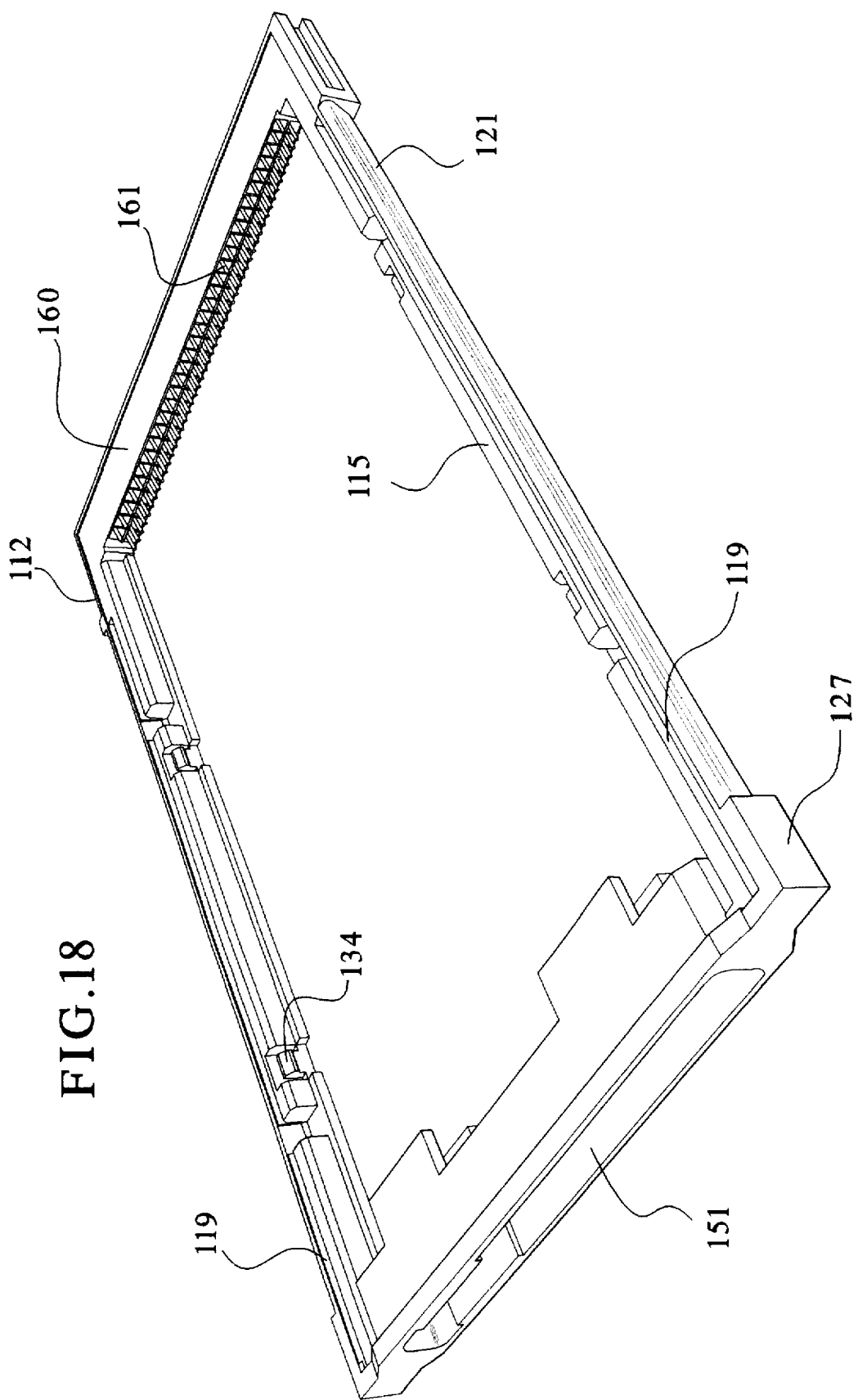
FIG. 18 is a perspective view of an alternative embodiment of a memory card frame.

Turning to FIG. 18, an alternative embodiment of frame 115 is shown. The frame 115 includes the same locking means for the bottom and top cover as shown above, including snap grooves 119, latch surfaces 121 and rib 134 for holding a printed circuit board thereunder. The frame 115 includes the first end 127 having a port 151 for receiving a modular header for connection to external sources. In particular, the frame also includes the second end 112 having an integrally molded socket connector 160. Socket connector 160 provides for connection between the printed circuit board of the memory card housing with internal components of the device to which the memory card housing is inserted. The socket connector 160 includes two rows of thirty-four contacts on 0.050 inch centers. However, this invention anticipates any number of sockets 161 or orientation of the socket connector 160 for variable applications. The integrally molded header 160 provides for a rigid frame 115 construction which does not need central support members.

Figure 19:
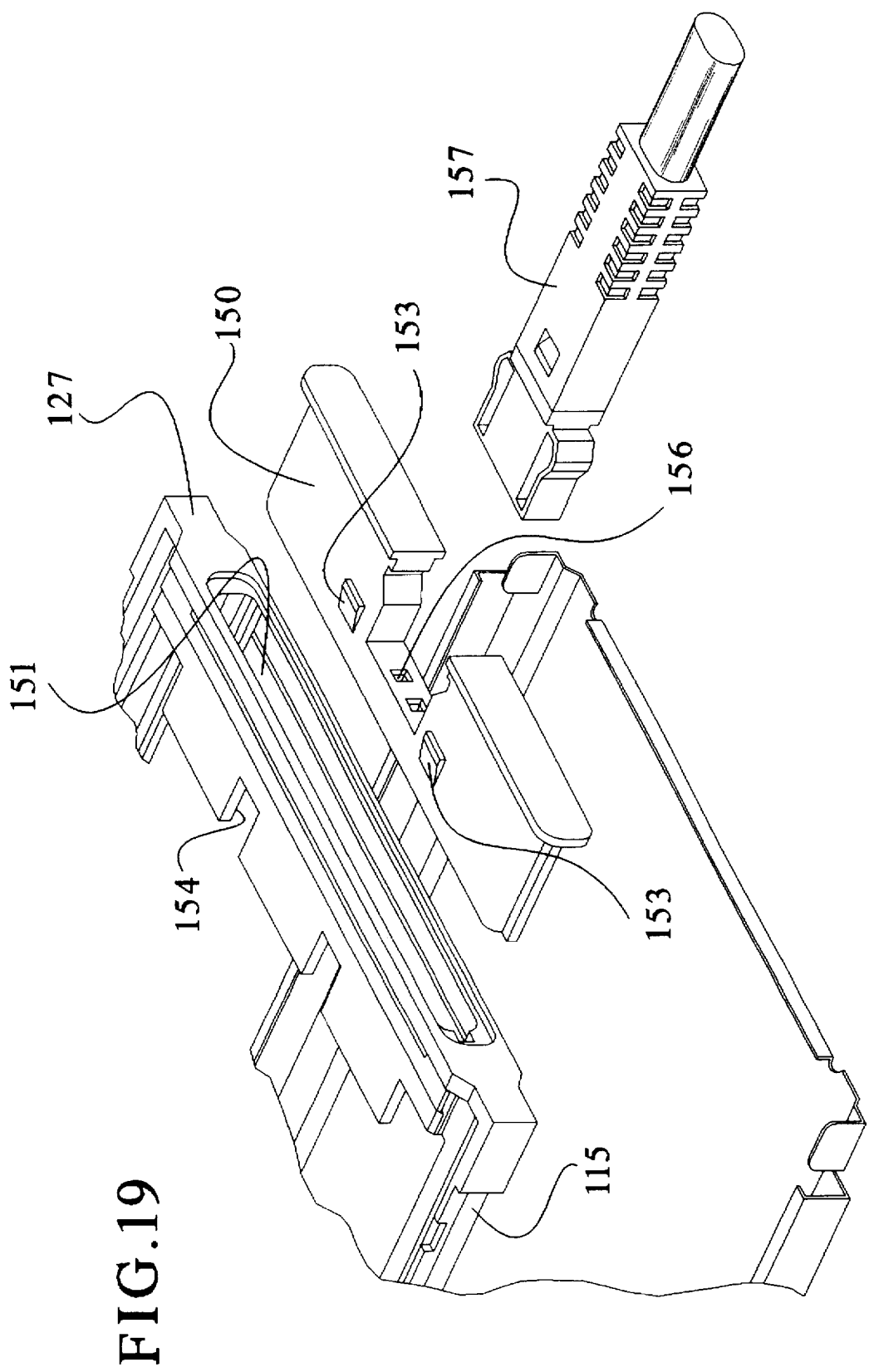
FIG. 19 is an exploded perspective view of an enlarged alternative embodiment of the memory card frame of FIG. 9.

Turning to FIG. 19, an alternative embodiment of the invention is shown having a modular header 150 insertable into port 151 at a first end 127 of frame 115. The port 151 is integrally molded into the frame 115 and provides for sliding mateability with modular header 150. The modular header 150 includes ears 153 for frictionally engaging the inner wall 154 of port 151 and securing the modular header 150 therein. The modular header 150 includes two contact sockets 156 on 0.100 inch centers and provides for connection to power connector 157 which provides functions for fax/modem applications.

The modular header 150 may easily be remolded and provided with alternative contact orientations to allow mating with alternative exterior connectors while still being insertable within port 151 of frame 115. Thus, remolding of the entire frame 115 is eliminated due to the novel port 151 and modular header 150.

The description above has been offered for illustrative purposes only, and it is not intended to limit the scope of the invention of this application which is defined in the following claims. For example, preferred embodiments have been discussed having specific numbers of ribs, tabs and latches in specific locations on the covers and frame. However, this invention may be modified to include other arrangements of fibs, tabs or latches without departing from the spirit or scope of the invention.

What is claimed is:

1. A memory card housing for housing a semi-conductor device including a first end wall which is exposed when said housing is inserted in a host device and a second end which is inserted into said host device, said housing comprising:

a frame having supports for holding a printed circuit board;

a top metallic cover having a means for mechanically securing said top cover to said frame;

a bottom metallic cover having a means for mechanically securing said bottom cover to said frame; and said top or bottom cover including a vertical tab at said first end of and perpendicular to said cover and received in an engaging groove in said first end wall of said frame.

2. The memory card housing of claim 1, comprising:

a first end of said frame including a port for receiving a modular header.

3. The memory card housing of claim 1, wherein said bottom cover includes a foot integral with said bottom cover and perpendicular to said cover having a means for latching with said frame.

4. The memory card housing of claim 1, including said frame having only four sides and no intermediate support members.

5. The memory card housing of claim 1, including a second end of said frame having an integrally molded socket connector.

6. The memory card housing of claim 1 wherein said socket connector includes a 68 position connector having sockets on 0.05 inch centers.

* * * * *